United States Patent [19]

L'Esperance et al.

[11] 4,024,852
[45] May 24, 1977

[54] SOLAR ENERGY REFLECTOR-COLLECTOR

[76] Inventors: Paul M. L'Esperance, Box 482, Oakwood Lane, Valley Forge, Pa. 19481; Alex Pavlak, Jug Hollow Road, Phoenixville, Pa. 19460

[22] Filed: Feb. 5, 1976

[21] Appl. No.: 655,431

[52] U.S. Cl. .............................. 126/270; 126/271; 136/206; 350/293
[51] Int. Cl.$^2$ .......................................... F24J 3/02
[58] Field of Search ........... 126/270, 271; 237/1 A; 350/293, 294; 136/206

[56] References Cited

UNITED STATES PATENTS

| | | | |
|---|---|---|---|
| 3,262,493 | 7/1966 | Hervey | 126/271 |
| 3,841,738 | 10/1974 | Caplan | 126/271 |
| 3,899,672 | 8/1975 | Levi-Setti | 126/270 X |
| 3,923,039 | 12/1975 | Falbel | 126/270 |
| 3,923,381 | 12/1975 | Winston | 350/293 |

*Primary Examiner*—Kenneth W. Sprague
*Attorney, Agent, or Firm*—Dorfman, Herrell and Skillman

[57] ABSTRACT

A system including a non-tracking reflector-collector for the concentration and collection of solar energy. An energy-collecting plate is disposed upright along a substantially horizontal axis substantially coincident with the east-west direction of the earth. The collector plate is positioned within a semi-tubular reflector having parabolic sidewalls. The reflector surfaces on opposite sides of the collector plate are parabolic surfaces, each having a focal point approximately coincident with the upper terminal edge of the collector plate. The axes of the parabolas which define the respective surfaces are rotated about or diverge from their common focal point at a substantial angle. The reflector sides are of laminated construction having a base portion of a lightweight rigid plastic sheet, an underlayer of plastic corrugated board and a reflective film on the interior surface. The collector plate receives energy entering the aperture between the reflective surfaces. In one of the preferred embodiments, the plate elevates the temperature of a heat exchange medium flowing therethrough. The heat exchange medium provides for storage and use of the collected energy. In a second embodiment, the collector plate receives solar energy which is converted into electrical energy for storage and use.

12 Claims, 11 Drawing Figures

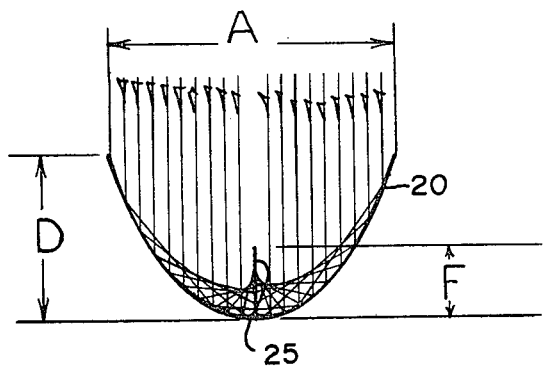
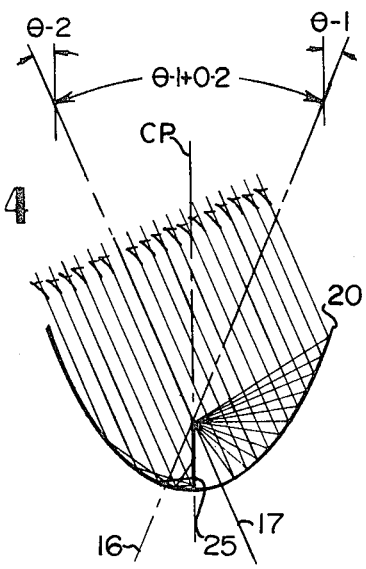
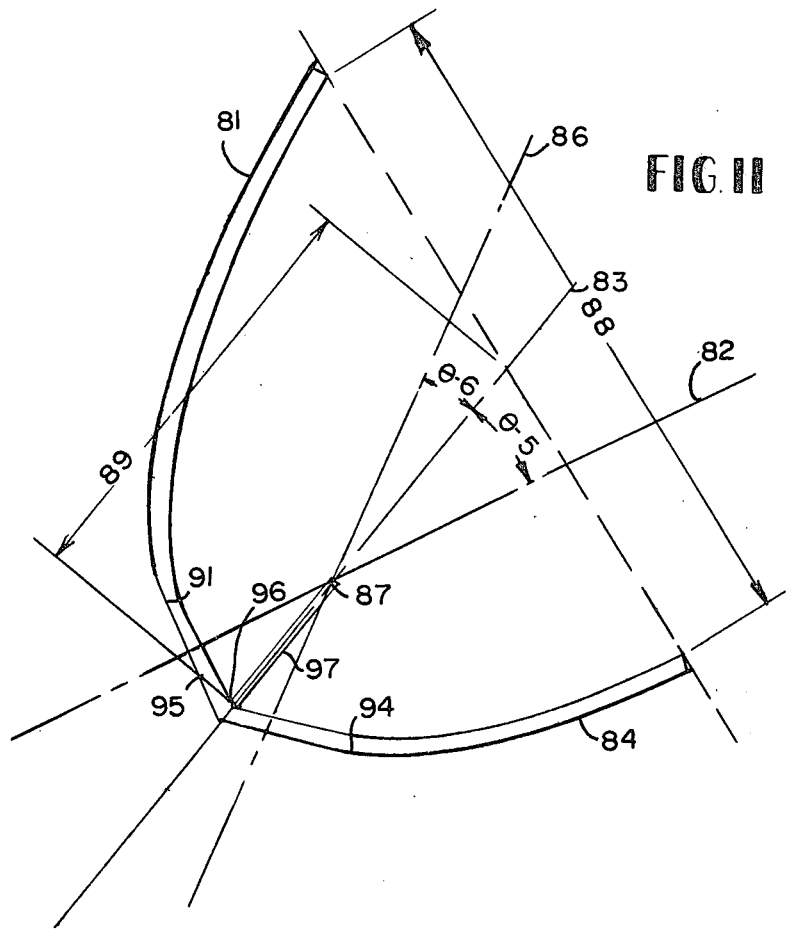

SOLAR ENERGY REFLECTOR-COLLECTOR

The present invention relates to solar energy collecting systems and particularly comprises a non-tracking focused solar energy collector for use in such systems.

Solar energy collectors take various forms designed for converting solar energy to useful energy. Solar heating systems collect the solar energy and transform it to heat energy which is stored in a heat sump or heat reservoir for ultimate use on demand. Solar energy is also collected by photoelectric energy conversion cells which utilize the solar energy to generate electrical energy, and the electrical energy is stored in storage devices or batteries for use on demand.

Solar energy has been limited in its use because of the economics of having collectors of sufficient size to collect a quantity of the solar energy which makes it feasible to use the energy for useful purposes. For example, a useful quantity of energy is obtained if the solar energy collectors are disposed in a collecting array covering a substantial area of the earth's surface so as to collect a corresponding amount of solar energy. The collecting devices necessary to convert the solar energy to useful energy are relatively expensive and the expense of such devices is generally proportionate to their surface area. Thus, substantial economies in the hardware necessary for collecting energy may be achieved if the solar energy is focused and concentrated so as to reduce the surface size necessary for collection.

Prior to the present invention, focused solar collectors have been designed to focus or concentrate the solar energy to a reduced collection area by aiming the collection device directly toward the sun and tracking the sun as it traverses the sky from morning to evening and also as it changes its elevation from the horizon between summer and winter elevations. Although theoretically the focused collectors should operate efficiently to generate useful energy, the cost of constructing, operating and maintaining the tracking mechanism have made such tracking-focused collectors impractical.

With the foregoing in mind, the present invention provides a collector for solar energy which focuses the solar energy, but which does not require tracking mechanism for year-round operation.

More particularly, the present invention provides a novel collector structure which is highly economical to manufacture and assemble and yet which is fully effective in operation and use.

Specifically, the present invention provides a collector which utilizes reflective surfaces to focus the solar energy in an extended focal zone, whereby standard collector elements may be used in the focal zone to collect the energy either for immediate use or for storage for future use.

The present invention permits collection of energy by heat exchange with a heat exchange medium and also collection of energy by photoelectric conversion cells.

The particular arrangement of the collector is such that the reflector element is approximately semicylindrical or semitubular in form, having a reflective surface on the interior surface of the semi-tubular member. The semi-tubular cross section is formed by two semi-parabolic surfaces having a common focal point and rotated toward one another so that the axes of the two parabolas defining the surfaces form an acute angle and the two apexes of the semi-parabolas are spaced apart and are connected by a dished reflective surface. A collector device extends between the common focal point and the dished connection surface so that any radiant energy entering thereof at any angle falling between the angles of the two parabolic axes impinges upon the collector device, either directly or by reflection from the semi-parabolic surfaces.

These and other objects of the invention are more fully set forth hereinafter with reference to the accompanying drawing, wherein:

FIGS. 3 and 4 are schematic views illustrating the incidence of radiant energy impinging upon the reflective surfaces of the collector, FIG. 3 illustrating the condition when the incidence is parallel to the center plane of the device and FIG. 4 illustrating condition when the incidence is parallel to the parabolic axis of one of the parabolic surfaces of the device;

Figure 1:
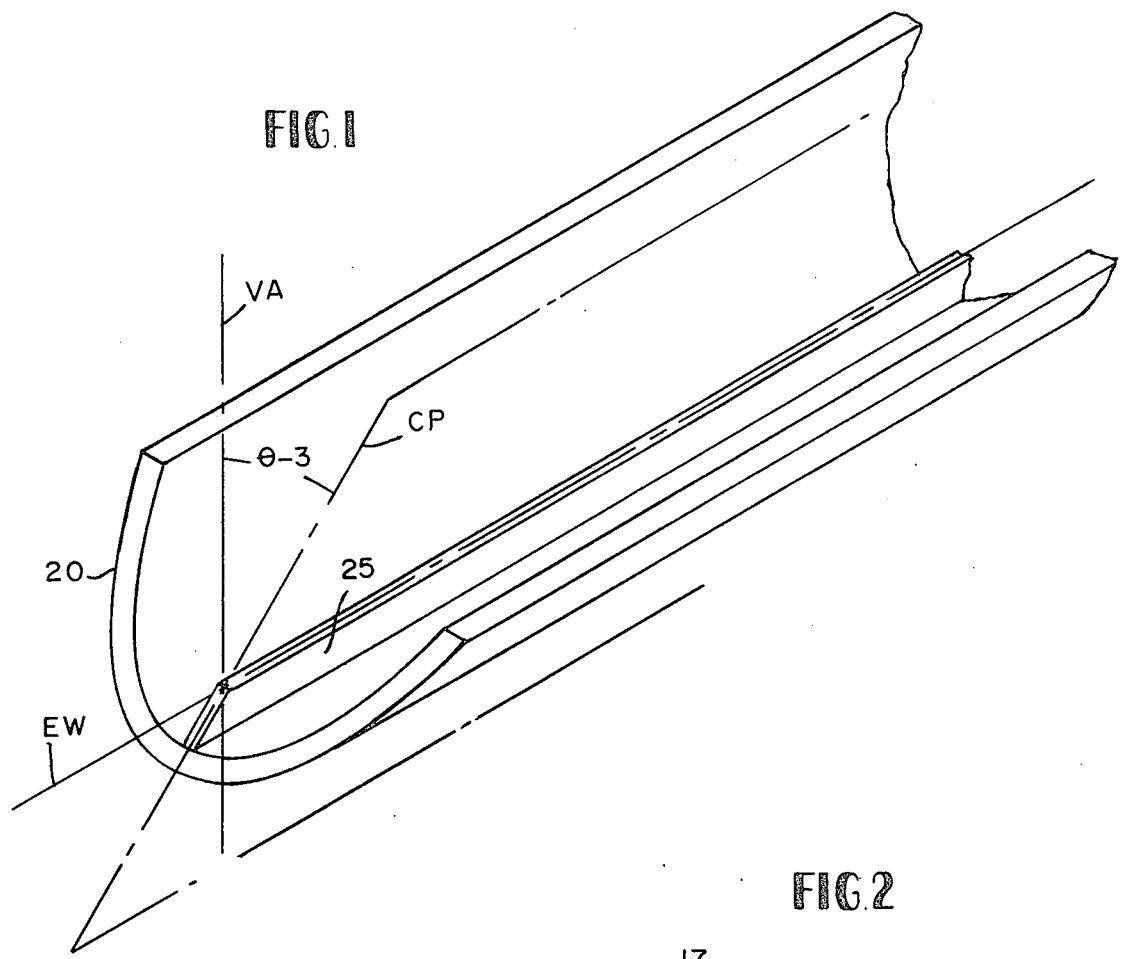
FIG. 1 is a perspective illustration of a semi-tubular refelective energy collector embodying the present invention having a collector plate disposed along the center plane of the device illustrating the orientation of the device relative to the east-west horizontal axis and the vertical axis.
Figure 2:
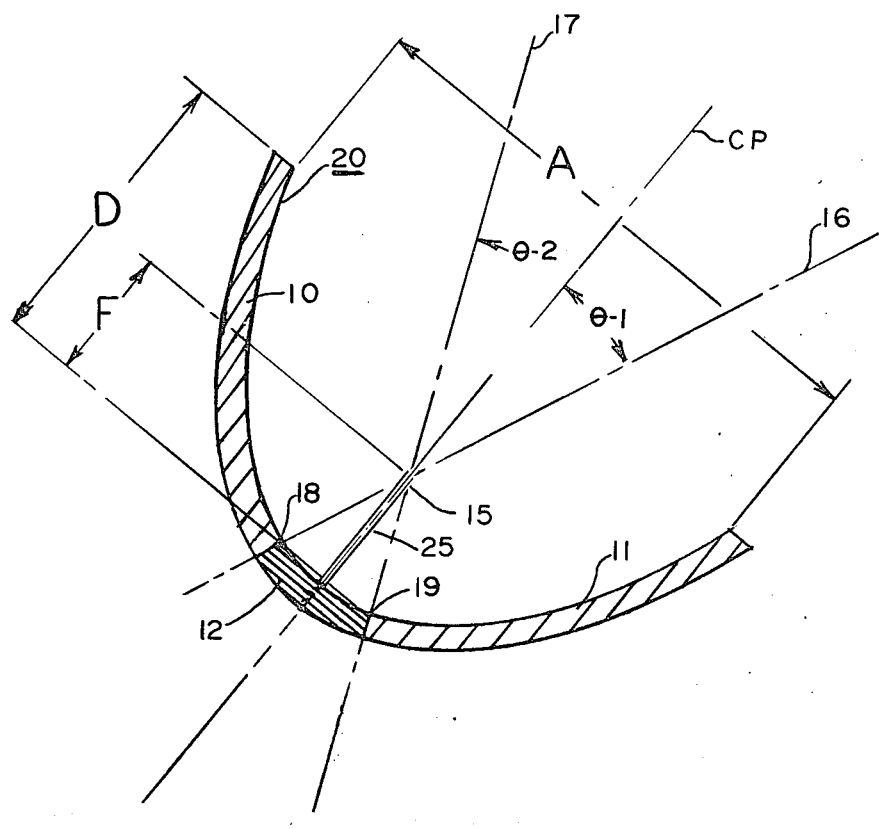
FIG. 2 is a cross-sectional view of the collector shown in FIG. 1, diagramming the parabolic form of the reflective surfaces which compose the semi-tubular collector of FIG. 1.

FIG. 11 is a view similar to FIG. 2 illustrating another embodiment of a reflector-collector made in accordance Referring now to the drawing, and particularly FIG. 1 thereof, the preferred form of collector comprises a semi-tubular body 20 having a reflective surface on the interior thereof which, as described more fully hereinafter, is designed to concentrate or focus radiant energy entering the aperture between the open sides of the body onto a collector 25 which projects upwardly from the bottom of the semi-tubular body. In the present instance, the collector is operable to collect solar energy and, to this end, the collector is positioned on edge, as shown, and extends longitudinally along an axis EW paralleling the east-west direction of the earth. Preferably, the center plane CP of the collector body is tilted southward with respect to the vertical axis VA by an angle θ-3 corresponding approximately to the latitude of the particular installation.

With reference to FIG. 2, the opposed interior sidewalls of the tubular body are parabolic in form and for the purpose of description, the illustration in FIG. 2 has been hatched to illustrate an upper sidewall 10, a lower sidewall 11 and a bottom wall 12. The sidewalls 10 and 11 are parabolic in form having a common focal point 15. The axis of the parabola forming the upper side 10 is shown in broken lines at 16 whereas the axis of the parabola forming the lower side 11 is shown in broken lines at 17. The side 10 terminates at its inner end at the apex of its parabolic form, as indicated at 18, and the side 11 terminates at its inner end in its apex 19. In the present instance, the bottom wall 12 is circular in configuration and tangential to the parabolic surfaces of the sidewalls 10 and 11. In the present instance, the focal length F, i.e., the distance between the focus and the apex, of the two parabolic surfaces 10 and 11, are equal to each other so that the semi-tubular reflector is symmetrical about a center plane CP which bisects the angle between the axes 16 and 17. Stated differently, starting with a pair of semi-parabolas having their axes coincident with a center plane CP, and having a common focal point 15, the semi-tubular reflector is formed by rotating the semi-parabolic surface forming the upper side 10 downwardly or clockwise from the center plane through an angle θ-1 about the focal point 15. Conversely, the semi-parabolic surface which forms the lower side 11 is rotated upwardly or counterclockwise through an angle θ-2, about the common focal point 15. The apexes of the two semi-parabolic surfaces are connected by a dished surface forming the bottom 12 of the refelector.

At their outer edges, the sides 10 and 11 form between them an aperture A through which the reflector may receive radiant energy. In the present instance, the aperture A has a width equal to four times the focal length F of the parabolic surfaces. As shown, with the stated relationship between the aperture and the focal length and with the angles θ-1 and θ-2 equal to each other, as shown, the depth D of the reflector is approximately 2.2 times the focal point F.

In the present instance, the angles θ-1 and θ-2 have been selected to be equal to each other and equal to 23.5° so as to provide an included angle of 47°. With the inclination of the center plane CP at the angle θ-3 equal to the latitude of the location of the collector, the normal incidence of sunlight will fall at an angle between the axes 16 and 17, both at the lowest noontime elevation of the sun above the southern horizon during winter and at the highest noontime elevation of the sun above the southern horizon in the summer. In this fashion, the entire radiant energy from the sun is directed into the aperture A throughout the year without the necessity for tracking of the reflector to follow the seasonal elevation of the sun. Since the axis of the center plane is parallel to the east-west axis, the daily rise and fall of the sun does not substantially affect the incidence of the sun's radiant energy into the aperture.

The radiant energy is collected by a collector plate 25 which extends from the focal point 15 to the bottom wall 12 of the reflector. As diagrammed in FIGS. 3 and 4, the energy entering the aperture at an angle between the angles of the axes 16 and 17 will impinge upon the collector plate 25, either directly or by reflection from the sidewalls 10 and 11 or bottom wall 12. As shown in FIG. 3, radiant energy entering the aperture A within a plane parallel to the center plane CP of the reflector will be reflected against the opposite sides of the collector plate, it has been found that the highest concentration of reflected energy is located approximately midway between the bottom wall 12 and the focal point 15. FIG. 4 illustrates the incidence of radiant energy entering the aperture at an angle parallel to the axis of one of the surfaces, in the present instance the surface 11. As shown, the energy entering above the focal axis impinges against the semi-parabolic surface 11 and since it enters parallel to the axis, it is reflected to the focal point at the top of the collector plate. Energy entering below the axis either impinges directly against the plate or impinges against the sidewall 10 at an angle which reflects it against the plate, either directly or after a series of reflections. It has been found that the collector plate in this instance receives the greatest energy adjacent the focal point on the upper side of the plate and adjacent the bottom of the reflector at the lower side of the plate. As the angle of incidence approaches the angle of the center plane, the concentrations of energy received by the plate on opposite sides thereof both move toward the center position shown in FIG. 3. Thus, any energy having an angle of incidence which falls at an angle included between the axes of the surfaces 10 and 11 is impinged directly or by reflection against the collector element 25.

A substantial factor in the practical use of solar energy is the cost in manufacturing and assembling the equipment necessary to collect the energy. The present invention provides a relatively inexpensive collector-reflector which may be manufactured at a relatively low cost and is of sufficiently lightweight construction to render the installation costs similarly low. The reflector-collector is mounted in a fixed position and is not required to be displaced to track the sun since, as described above, radiant energy having an angle of incidence which falls within the included angle between the axes of the two semi-parabolic surfaces is impinged against the collector element 25, either directly or by reflection. Thus, the structural components of the collector-reflector assembly are mounted in a fixed position and are not subject to stress or strain by reason of displacement of the components therof.

Figure 5:
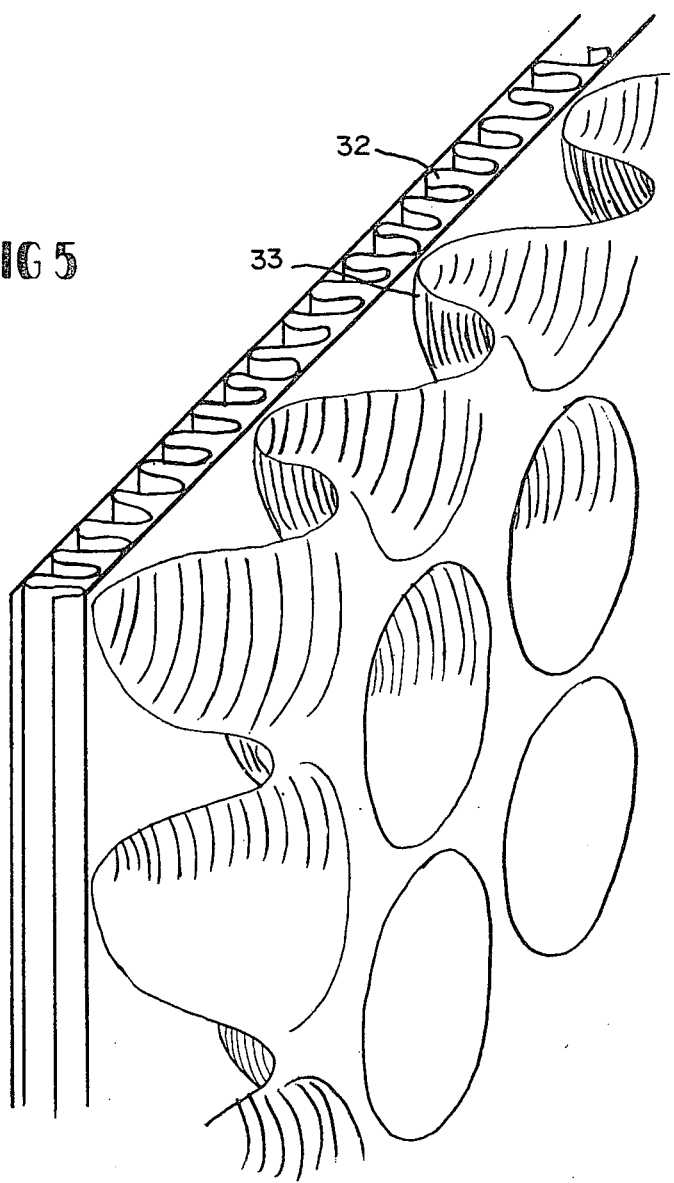
FIG. 5 is a greatly enlarged fragmentary perspective view illustrating a preferred construction of the reflector structure of the present invention.

The preferred construction of the reflector 20 is shown in the enlarged fragmentary view of FIG. 5. The reflector walls 10, 11 and 12 are preferably formed of a laminated structure consisting of a metalized film 31 on its inner surface, an underlayer 32 which provides a smooth base for the film 31, in the present instance comprising double-faced corrugated board, and a rigid support element 33 in the form of a molded plastic sheet.

The metalized film 31 preferably has a metal undersurface with a carrier of a synthetic plastic material on its exposed surface in order to withstand the rigors of exposure to the direct radiant energy and the atmospheric contaminants. Metalized "Mylar" polyester film and "Tedlar" polyvinylfluoride film are readily available at reasonable cost. Films of this nature prevent oxidation and atmospheric degradation of the metalized reflective surface and, at the same time, provide a high reflective efficiency minimizing any loss of radiant energy.

The corrugated board 32 is disposed with its corrugations extending circumferentially of the collector-reflector so as to impart rigidity to the structure. The board is really formed to provide the desired semi-parabolic surfaces of the sidewalls 10 and 11 and the cylindrical surface of the bottom wall 12, as shown. The undersurface of the metalized film is bonded to the smooth face of the corrugated board, preferably after it is formed to the parabolic shape or during formation in order to avoid introduction of surface imperfections in the reflected film 31. It is preferred to employ hot glue or contact adhesive as an adhesive layer to firmly unite the film to the corrugated board. The corrugated board is preferably formed of a synthetic plastic, in the present instance polypropylene which is readily molded to the desired shape, for example Hercules "Bramaboard".

Figure 6:
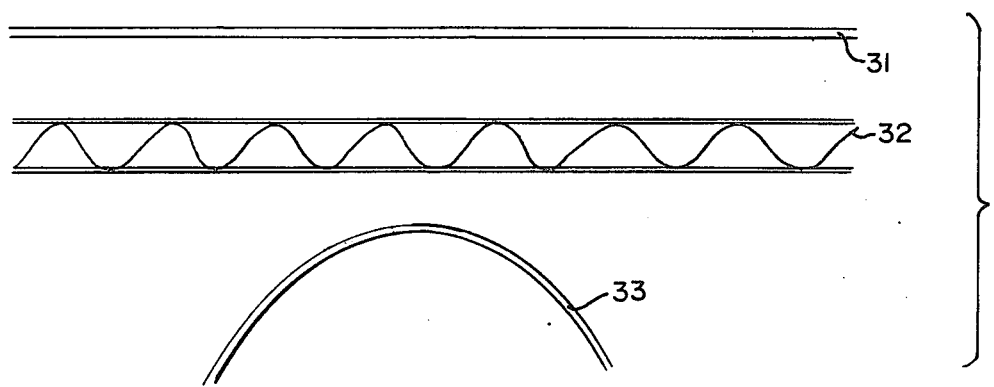
FIG. 6 is an exploded perspective view of the structure shown in FIG. 5, illustrating the separate components which are united to form the reflector.

The support layer 33 is a sheet of polypropylene or similar material, which is lightweight yet has strength and rigidity when molded to support the underlayer 32 in the desired form. The nature of the support layer 33 permits it to be bonded to the underlayer 32 to provide a rigid structure support. The waffled or dimpled form of the structural member 33 provides a structural shape having maximum rigidity with minimum weight and provide the necessary structural rigidity to the collector-reflector to withstand normal handling and wind loads during installation and use. FIG. 6 illustrates the components of the walls of the collector-reflector in an exploded view, the thickness of the individual components being modified for the purpose of clarity in illustration.

Figure 7:
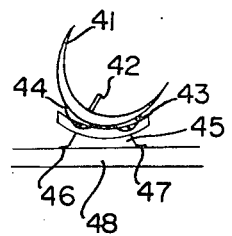
FIG. 7 illustrates a typical support for mounting the reflector-collector.

The lightweight nature of the collector-reflector of the present invention permits the devices to be mounted on many existing roof structures without substantial modification. A suitable mounting arrangement is shown schematicallly in FIG. 7 wherein a semi-tubular collector-reflector shell 41 having a collector element 42 disposed therein is provided with external lugs 43 and 44 which cooperate with a mounting cradle 45. The mounting cradle 45 is provided with foot portions 46 and 47 which may be mounted on the exposed surface of a roof structure 48 or may be interleaved with the shingles in accordance with conventional practice. Where the collector-reflector is installed concurrently with the roof structure, other mounting means may be employed as desired.

Figure 8:
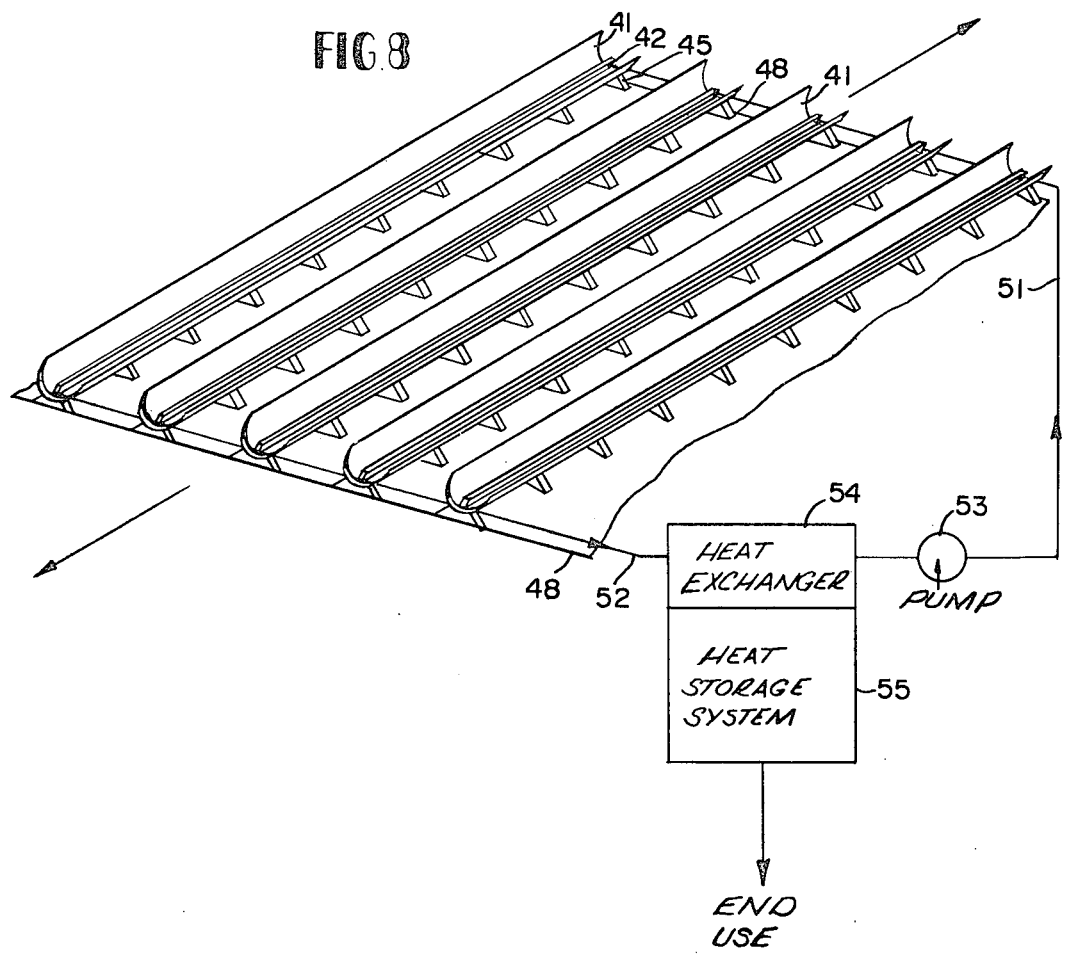
FIG. 8 is a perspective diagrammatic view of a collector field illustrating the collection of radiant energy by the use of a heat exchanger and a heat storage system.

FIG. 8 illustrates a collector array embodying a plurality of individual collectors which have their longitudinal center planes disposed parallel to the east-west axis and to each other. In the present instance, the collectors are mounted on an inclined plane, in the present instance, a slanted roof structure 48, and they are spaced apart so as to insure that the upper wall of one collector-reflector 41 does not shadow the aperture of the upwardly-adjacent collector-reflector. The spacing of the devices in FIG. 8 has been exaggerated for purpose of clarifying the illustration so that the successive mounting cradles 45 which are spaced along the length of the collector-reflector assembly may be readily apparent.

In the present instance, the collector devices 42 comprise flat-plate energy absorbers comprising an elongated plate having fluid passages extending therethrough. Heat exchange medium in the form of water, or another fluid, is caused to flow through the passages to absorb the heat focused on the collector element. The passages of the collector elements 42, in the present instance, are connected in parallel to transfer means in the form of inlet and outlet headers 51 and 52. A pump 53 is provided to effect circulation of the heat exchange medium through the conduit means including the inlet and outlet headers 51 and 52 and the passges in the collector plates 42. A heat exchanger 54 is included in the circuit to transfer heat to a heat storage system 55 from which the heat may be used for a variety of end uses. In the winter, the heat stored in the unit may be used for house heating or other purposes, and in the summer the heat may be used as the energy input to an air-conditioning system. Heat sumps of various character have been proposed and the selection of a particular storage system is dependent upon numerous factors which it is not necessary to set forth herein. Where the demand is immediate, the storage system may be bypassed to utilize the energy from the heat exchanger directly.

In accordance with the present invention, since the solar energy is focused and concentrated by the system of the present invention, the temperature in the heat exchange medium circulating through the collector plates 42 may be elevated to substantially above the temperatures obtained in solar thermal cells which do not focus or concentrate the energy. The higher temperatures obtained by the present invention afford a greater selection of end uses to which the energy may be put and, accordingly, a similarly greater opportunity for efficient and effective utilization of the collected energy.

Figure 9:
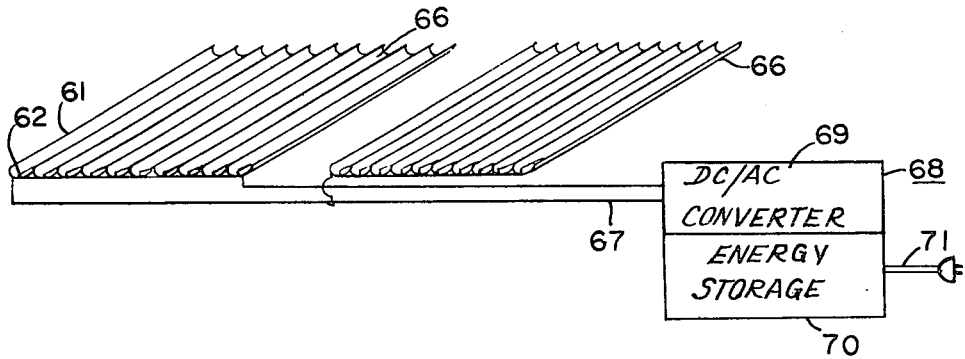
FIG. 9 is a view similar to FIG. 8, illustrating a collector field using photo-voltaic cells.
Figure 10:
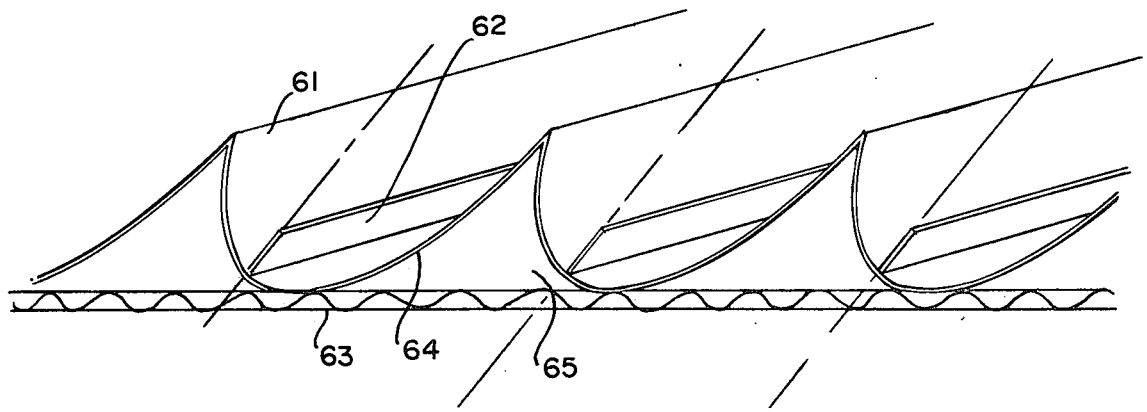
FIG. 10 is an enlarged view of the collector array shown in FIG. 7.

FIGS. 9 and 10 show a similar system embodying collector-reflectors having a semi-tublular reflector 61 surrounding collectors 62, which in the present instance, comprise photo-voltaic cells. The geometry of the semi-tubular reflectors 61 is identical to the geometry of the reflectors described above, and the photo-voltaic cells are mounted to extend along the longitudinal center plane of the shell through the common focal point of the two parabolic surfaces. In the present instance, the aperture of the reflector is parallel to the inclined supporting surface 63 and accordingly, the reflectors may be mounted with their apertures in edge-to-edge abutting relation without danger of shadowing adjacent apertures by the projecting sidewalls.

As shown in FIGS. 9 and 10, the semi-tubular reflectors are of smaller dimension than the reflectors described in connection with the previous embodiments. In the present instance, they are mounted upon a base consisting of a corrugated board 63 of synthetic plastic material, in the present instance, polypropylene. The reflective surface is formed by a metalized film 64 of plastic material, similar to that described above, bonded to an underlayer 65 providing a smooth mounting for the film. Preferably, the underlayer and the support comprise polypropylene. Alternatively, the support 65 for the metalized film may be molded from a foamed plastic providing a solid undersupport for the metalized film. The surface upon which the metalized film is adhered may be formed by the skin of the foamed plastic material.

In the system shown in FIG. 9, the photo-voltaic cells are mounted in two sheets 66, and the cells in each sheet are connected in series and the sheets themselves are connected in parallel. The sheets are connected by electrical conduits 67 providing a means for transferring the electrical energy generated by the cells to suitable energy conversion device 68. The conduits 67 transfer the energy to the device 68 which conditions the electricity generated by the cells for use. In the present instance, the energy conditioner 68 comprises a DC/AC conversion device 69 having an energy-storage device 70 associated therewith. The energy output from the storage device is indicated at 71.

As in the previous embodiment, the focusing of the energy by the reflector concentrates the energy enetering the aperture of the reflector into the focal area where the cell is mounted. Where the cell area is substantially less width than the aperture area, there is a substantial saving in the cost of the photovoltaic cells.

In the previous embodiment of the invention, the semi-tubular reflector is symmetric about the center plane, the aperture being formed between the free edges of the semi-parabolic surfaces in a plane substantially perpendicular to the center plane of the device. Furthermore, the collecter is disposed entirely within the center plane of the device extending from the bottom wall 12 past the focal point 15. The extent of projection beyond the focal point 15 is limited so as to minimize the size of the collector element without sacrificing the radiant energy which might be diverted sligthtly outwardly from the focal point 15.

In FIG. 11, an alternate embodiment of the device is shown. In this embodiment, the upper sidewall 81 ia parabolic in form having a parabolic axis 82 which is rotated clockwise from the center plane 83 by an angle θ-5. The lower side 84 of the semi-tubular reflector is likewise parabolic in shape having its axis 86 rotated counterclockwise by an angle θ-6 from the center plane 83, both rotations occuring about the common focal point 87 of the two parabolas. In this instance, the angles θ-5 and θ-6 are dissimilar. The depth of the upper wall 81 is greater than the depth of the lower wall 84 so that the aperture 88 defined between the free edges of the walls 81 and 82 is in a plane inclined other than perpendicular to the center plane 83. The parabolic surfaces 81 and 84 terminate short of their respective apexes, as indicated at 91 and 94, and are connected by a dished bottom wall 95 extending between the inner terminals of the parabolic surfaces. The depth dimension of the reflector, as indicated at 89, is measured between the bottom wall 95 and the intersection of the plane of the aperture 88 with the center plane 83.

In the present instance, the dished bottom wall 95 tapers to a ridge 96 on the center plane 83 of the collector-reflector. The energy collector device 97 extends from the ridge 96 in the bottom wall 95 past the common focal point 87 of the two parabolic surfaces. The extension past the focal point is limited, thereby providing partial compensation for diffuse radiation which might otherwise be reflected out of the collector-reflector. The inclination of the tapered parts of the bottom wall 95 is such as to insure reflection of radiant energy incident thereon against the collector plate 97, thereby insuring impingement of the total energy entering the aperture 88 at an angle between the angles of the axes 82 and 86, as described above. Preferably, the collector plate 97 and the ridge 96 are disposed within the center plane of the reflector-collector, but for functional purposes, it may be desired to position the ridge in the dished bottom wall offset from the center plane, and the plate may not ncessarily be coplanar with the center plane.

While particular embodiments of the present invention have been herein illustrated and described, it is not intended to limit the invention to such disclosure, but changes and modifications may be made herein and thereto within the scope of the following claims.

I claim:

1. A radiant solar energy collector system comprising an elongated collector-reflector having a longitudinal center plane parallel to the east-west axis, said collector-reflector including a longitudinal collector element and a semi-tubular reflector having two sidewalls and a bottom wall enclosing said collector element and having reflective surfaces to accept radiation energy entering the reflector between said sidewalls and reflect it so as to impinge against said collector element, said transfer means to receive the energy from said collector element and condition the same for use, said two sidewall reflective surfaces comprising walls extending parallel to the east-west axis with semi-parabolic interior surfaces having a common focal point coincident with said center plane, each semi-parabolic surface having its axis extending from said focal point outwardly away from said center plane at a fixed angle and its apex adjacent said bottom wall whereby said semi-parabolic surface does not intersect the center plane, the fixed angles of said two sidewall axes of opposite sides of the center plane defining between them an included angle for reception of radiant energy, said bottom wall being dished and extending between said apexes, said collector element extending from said common focal point to said bottom wall.

2. A system according to claim 1 wherein said collector element comprises an elongated plate having fluid passages extending therethrough, said transfer means comprising conduit means and a pump for circulating heat exchange medium through said passages to heat the medium with the radiant energy impinging against said collector element.

3. A system according to claim 1 wherein said collector element comprises a flat plate extending from said bottom wall outwardly past said focal point to collect diffuse radiation.

4. A system according to claim 1 wherein said collector element comprises photovoltaic cells facing said reflective surfaces, and said transfer means comprises electrical connections to collect the electrical energy generated by said photovoltaic cells.

5. A system according to claim 1 wherein said reflector is laminated in cross section including a support element, a smooth underlayer mounted on said support element to define the shape of the interior side and end walls, and a thin, reflective film bonded to said underlayer, said film comprising a thin, flexible plastic sheet having a metalized reflective surface on the underside, said film being operable to reflect radiant energy with minimal degradation of the reflective efficiency by exposure to sunlight or atmospheric contaminants.

6. A system according to claim 5 wherein said underlayer comprises a double-face-corrugated board of weather-resistant plastic material.

7. A system according to claim 6 wherein said support element is a rigid sheet of plastic material molded to a structural shape and bonded to said corrugated board to provide a rigid structural support.

8. A system according to claim 7 wherein said film is selected from a group consisting of polyester film and polyvinyfluroride film, and said board and support element are composed of polypropylene sheet material, the board and support element being bonded together and said film being bonded to said board by an adhesive layer.

9. A system according to claim 1 wherein each of said semi-parabolic surfaces extends outwardly from said bottom wall a preselected distance along the center plane and terminates in an edge defining one of the two opposite edges of an aperture for the entrance of the radiant energy between said sidewalls, the preselected distance and the angular disposition of said parabolic axes providing an aperture with a width at least twice the width of the collector element between said focal point and the bottom wall.

10. A system according to claim 9 wherein said included angle is approximately 47°, the preselected distance is approximately 2.2 times the width of the collector element and the aperture width is approximately 4.0 times the width of the collector element.

11. A system according to claim 1 wherein said collector-reflector is mounted in an array of similar collector-reflectors having their longitudinal axes parallel to each other and spaced laterally to avoid shadowing of the aperture of one collector-reflector by the sidewall of an adjacent collector-reflector.

12. A system according to claim 11 wherein the collector-reflectors are mounted upon an inclined plane, and the apertures are all disposed parallel to said mounting plane in edge-to-edge relation to provide a combined aperture width corresponding to the width of said array in said plane.

* * * * *

UNITED STATES PATENT OFFICE
CERTIFICATE OF CORRECTION

Patent No. 4,024,852          Dated May 24, 1977

Inventor(s) Paul M. L'Esperance and Alex Pavlak

It is certified that error appears in the above-identified patent and that said Letters Patent are hereby corrected as shown below:

Column 2, line 45, after "dance" insert --with the present invention--;

Column 4, line 59, "realily" should be --readily--;

Column 6, line 19, "semi-tublular" should be --semi-tubular--;

Column 6, line 62, "eneter-" should be --enter- --;

Column 7, line 12, "ia" should be --is--;

Claim 1, line 7, "radiation" should be --radiant--;

Claim 1, line 9, "said" (second occurrence) should be --and--.

Signed and Sealed this second Day of August 1977

[SEAL]

Attest:

RUTH C. MASON
*Attesting Officer*

C. MARSHALL DANN
*Commissioner of Patents and Trademarks*

UNITED STATES PATENT OFFICE
CERTIFICATE OF CORRECTION

Patent No. 4,024,852  Dated May 24, 1977

Inventor(s) Paul M. L'Esperance and Alex Pavlak

It is certified that error appears in the above-identified patent and that said Letters Patent are hereby corrected as shown below:

Claim 11, line 1, "claim 1" should be --claim 9--.

Signed and Sealed this

Fourth Day of October 1977

[SEAL]

Attest:

RUTH C. MASON
Attesting Officer

LUTRELLE F. PARKER
Acting Commissioner of Patents and Trademarks